United States Patent [19]

Kamuro et al.

[11] Patent Number: 4,709,168

[45] Date of Patent: Nov. 24, 1987

[54] REFERENCE VOLTAGE GENERATING CIRCUIT FOR ENHANCEMENT/DEPLETION MOSFET LOAD CIRCUIT FOR DRIVING LOGIC CIRCUITS

[75] Inventors: Setsufumi Kamuro, Yamatokoriyama; Mikiro Okada, Nara, both of Japan

[73] Assignee: Sharp Kabushiki Kaisha, Osaka, Japan

[21] Appl. No.: 767,473

[22] Filed: Aug. 20, 1985

[30] Foreign Application Priority Data

Sep. 10, 1984 [JP] Japan ................................ 59-190258

[51] Int. Cl.⁴ .................... H03K 17/16; H03K 19/017; H03K 5/12; H03K 17/687

[52] U.S. Cl. .................................... 307/448; 307/443; 307/263; 307/268; 307/574

[58] Field of Search ............... 307/574, 581, 584, 481, 307/200 B, 443, 448, 269, 263, 296 R, 297

[56] References Cited

U.S. PATENT DOCUMENTS

| | | | |
|---|---|---|---|
| 4,307,308 | 12/1981 | Sano | 307/475 |
| 4,423,339 | 12/1983 | Seelbach et al. | 307/464 |
| 4,450,369 | 5/1984 | Schuermeyer | 307/475 |
| 4,451,744 | 5/1984 | Adam | 307/297 |
| 4,490,632 | 12/1984 | Everett et al. | 307/475 |
| 4,568,844 | 2/1986 | O'Connor | 307/475 |

*Primary Examiner*—John S. Heyman
*Assistant Examiner*—M. R. Wambaugh
*Attorney, Agent, or Firm*—Flehr, Hohbach, Test, Albritton & Herbert

[57] ABSTRACT

A reference voltage generating circuit comprises a depletion type MOS transistor of which the gate and the drain are connected to a power source and an enhancement type MOS transistor of which the gate and the drain are connected to the source of the depletion type MOS transistor through a junction from which a reference voltage is outputted. This reference voltage is adapted to be applied to the gate of an enhancement type MOS transistor in a load circuit composed of enhancement/depletion MOS transistors and serving to drive a logical circuit.

8 Claims, 5 Drawing Figures

Figure 1:
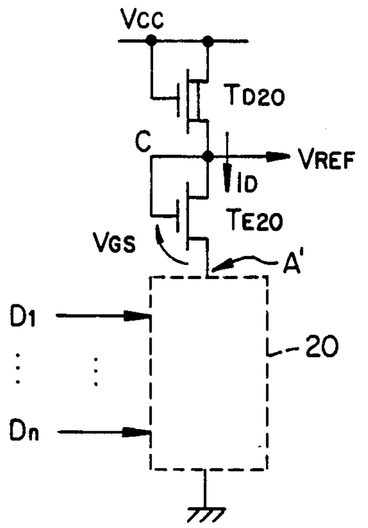

REFERENCE VOLTAGE GENERATING CIRCUIT FOR ENHANCEMENT/DEPLETION MOSFET LOAD CIRCUIT FOR DRIVING LOGIC CIRCUITS

This invention relates to a reference voltage generating circuit and more particularly to a reference voltage generating circuit adapted to apply a reference voltage to a load circuit section composed of enhancement/depletion type (E/D) MOS transistors serving to drive a logical circuit.

When a load circuit section for driving a logical circuit such as a decoder is composed of E/D MOS transistors, it is necessary to apply to the load circuit section a reference voltage appropriate for the logical circuit in order to obtain an accurate output from the logical circuit. In the past, however, it was not easy to match the circuits and it was time-consuming to design circuits because use was made of voltage generating circuits structured independently of the circuit structures of the load circuit and logical circuit sections. Moreover, it was not always possible to attain sufficient reliability when an actual circuit was driven.

It is therefore an object of the present invention in view of the drawbacks of the conventional circuits to provide a reference voltage generating circuit capable of supplying to a load circuit section composed of E/D MOS transistors serving to drive a logical circuit a reference voltage of an appropriate value corresponding to the aforementioned logical circuit.

Another object of the present invention is to provide a reference voltage generating circuit which is capable, when a logical circuit is connected to an E/D MOS load circuit which drives it, of supplying to an enhancement type MOS gate of the load circuit a reference voltage $V_{ref}$ of an appropriate value corresponding to the strucutre of the logical circuit.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

A reference voltage generating circuit according to one embodiment of the present invention is adapted to apply a reference voltage to a driving circuit composed of E/D MOS transistors for driving a logical circuit. In order to apply a reference voltage of appropriate value corresponding to the logical circuit to the gate of an enhancement type MOS transistor of the aforementioned driving circuit, this reference voltage generating circuit comprises a depletion type MOS transistor of which the gate and the drain are connected to a power source $V_{CC}$ and an enhancement type MOS transistor of which the gate and the drain are connected to the source of the aforementioned depletion type MOS transistor such that a reference voltage $V_{ref}$ is outputted from this junction point.

In the case of a circuit comprising a plurality of enhancement type MOS transistors wherein the aforementioned logical circuit is connected in parallel between the source of the aforementioned enhancement type MOS transistor and the ground, there is connected an enhancement type MOS transistor which is substantially an equivalent of the transistor having the smallest amplification factor $\beta$ among the aforementioned plurality of enhancement type MOS transistors. In the case of a circuit comprising a plurality of enhancement type MOS transistors wherein the logical circuit is connected in series, a circuit which is substantially the same as the logical circuit is connected. As a further example, a circuit which is substantially the same as the logical circuit may be connected between the source of the aforementioned enhancement type MOS transistor and the ground in the case of a circuit wherein the aforementioned logical circuit is composed of a single enhancement type MOS transistor or a circuit comprising a depletion type MOS transistor.

Figure 2:
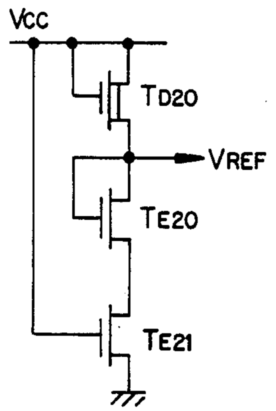
Figure 3:
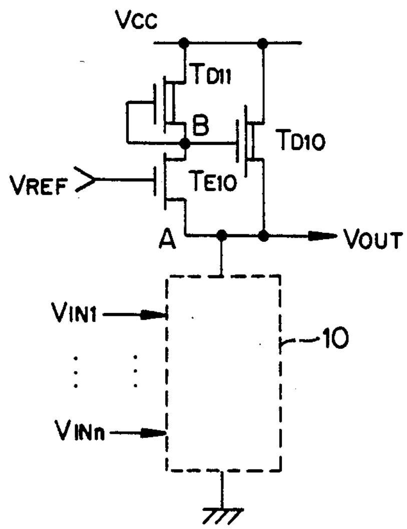
Figure 4:
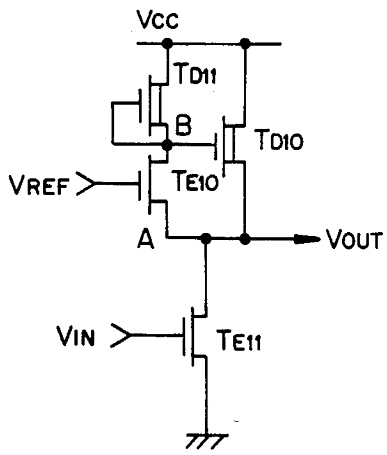
Figure 5:
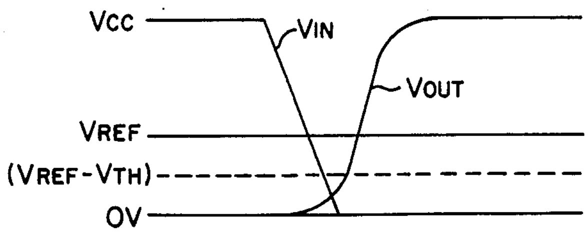

The accompanying drawings, which are incorporated in and form a part of the specification, illustrate embodiments of the present invention and, together with the description, serve to explain the principles of the invention. In the drawings:

FIG. 1 is a circuit diagram of a reference voltage generating circuit according to one embodiment of the present invention, FIG. 2 is a circuit diagram of a reference voltage generating circuit according to another embodiment of the present invention, FIG. 3 is a diagram of a circuit for driving a logical circuit to which a reference voltage may be applied from the reference voltage generating circuit of the present invention, FIG. 4 is a diagram of a circuit for driving a logical circuit according to another embodiment of the present invention, and FIG. 5 is a waveform diagram for explaining the operation of the circuit of FIG. 4.

This invention relates to a reference voltage generating circuit for generating a reference voltage to be inputted to an enhancement type MOS transistor in a circuit of which the load circuit section for driving a logical circuit is composed of E/D MOS transistors. Before such a reference voltage generating circuit itself is considered, however, the load circuit section composed of E/D MOS transistors to which the reference voltage is applied will be described first.

The load circuit section considered herein for driving a logical circuit section such as a decoder comprises E/D MOS transistors. For the purpose of imporving its capability for driving an output load and increasing the speed of operation, it includes a shown in FIG. 3 a depletion type MOS transistor $T_{D10}$ connected between a power source $V_{CC}$ and a logical circuit section 10 and in parallel with the series connection of an enhancement mode MOS transistor $T_{E10}$ and another depletion type MOS transistor $T_{D11}$.

Reference being made to the circuit of FIG. 3, the reference voltage $V_{ref}$ inputted to the gate of the enhancement type MOS transistor $T_{E10}$ plays an improtant role for correctly outputting an output signal $V_{out}$ in correspondence with an input signal $V_{in}$, and is adapted to be generated by a separate circuit. In other words, a reference voltage generating circuit of the present invention is adapted to be used for the purpose of supplying the required reference voltage $V_{ref}$. The aforementioned logical circuit section 10 may take various forms, depending on the logic to be applied, and thus can include a NAND, a NOR, a combination of NAND and NOR or a load element in addition to the above.

For the purpose of simplifying the explanation, let us consider an example wherein the logical circuit section 10 comprises a simple inverter logic using a MOS transistor $T_{E11}$ as shown in FIG. 4. FIG. 5 is a diagram of voltage variations with time and is presented for facilitating the explanation of the generation of the output voltage $V_{out}$ from the circuit of FIG. 4.

In the circuit of FIG. 4, if an input voltage $V_{in}$ applied an enhancement type MOS transistor $T_{E11}$ of the logical circuit section 10 changes from a high level (e.g., $V_{CC}$) to a low level (e.g., 0), the voltage $V_{out}$ at the junction point A which is between the enhancement type transistors $T_{E10}$ and $T_{E11}$ and serves as the output point, increases as the depletion type transistors $T_{D10}$ and $T_{D11}$ are charged. When the charging continues and the voltage $V_{out}$ reaches the value ($V_{ref}-V_{th}$) where $V_{th}$ is the threshold voltage of the enhancement type MOS transistor $T_{E10}$, the enhancement type MOS transistor $T_{E10}$ is cut off. Thereafter, since the enhancement type MOS transistor $T_{E10}$ is cut off, the serially connected depletion type MOS transistor $T_{D11}$ serves only to charge the junction point B between the depletion type MOS transistor $T_{D11}$ and the enhancement type MOS transistor $T_{E10}$ and the potential at B approaches the source voltage $V_{CC}$ quickly. This causes a quick increase in the current by which the depletion type MOS transistor $T_{D10}$ charges the point A and, as a result, the output voltage $V_{out}$ quickly approaches the level of the source voltage $V_{CC}$.

A very important factor regarding the load circuit structure described above is the level of the reference voltage $V_{ref}$ applied to the gate of the enhancement type MOS transistor $T_{E10}$. If the reference voltage $V_{ref}$ is excessively low, the enhancement type MOS transistor $T_{E10}$ becomes cut off even when the logical circuit section 10 of FIG. 3 (or the enhancement type MOS transistor $T_{E11}$ in the example of FIG. 4) is in an ON condition so that the function as a load circuit cannot be properly performed. If the reference voltage $V_{ref}$ is excessively high, on the other hand, time required for charging becomes too long because the point A is charged while the potential at B which supplies the gate voltage to the depletion type MOS transistor $T_{D10}$ is nearly equal to the potential at A and the gate-source voltage $V_{GS}$ of the depletion type MOS transistor $T_{D10}$ is nearly zero until the enhancement type MOS transistor $T_{E10}$ is cut off. In short, it is extremely important to set the reference voltage $V_{ref}$ appropriately in order to obtain a correct an output from a logical circuit.

Next, a reference voltage generating circuit of the present invention will be described which is capable of supplying such a reference voltage $V_{ref}$ of an appropriate value corresponding to a logical circuit. There is shown in FIG. 1 a circuit for generating a reference voltage $V_{ref}$ to be inputted to the gate of an enhancement type MOS transistor $T_{E10}$ in the circuit of FIG. 3. It comprises a depletion type MOS transistor $T_{D20}$ of which the gate and the drain are connected to a power source $V_{CC}$ and a junction point C is provided between the source of the depletion type MOS transistor $T_{D20}$ and the gate and the drain of an enhancement type MOS transistor $T_{E20}$. The junction point C serves as output terminal through which the reference voltage $V_{ref}$ can be applied. This depletion type MOS transistor $T_{D20}$ is structured substantially as an equivalent of the depletion type MOS transistor $T_{D10}$ in the load circuit section of FIG. 3. The reference voltage $V_{ref}$ is applied to the load circuit composed of E/D MOS transistors for driving a logical circuit. The logical and load circuit sections are structured as shown in FIG. 3.

Between the source of the enhancement type MOS transistor $T_{E20}$ and the ground potential, there is inserted, as will be explained below, an appropriate circuit 20 in view of the circuit structure of the logical circuit to which the generated reference voltage $V_{ref}$ is applied. This inserted circuit 20 is structured as follows, corresponding to the structure of the logical circuit section.

If the logical circuit section 10 is composed of a plurality of enhancement type MOS transistors connected in parallel as in the case of an ordinary decoder, the inserted circuit 20 may comprise an enhancement type MOS transistor substantially equal to the transistor having the smallest amplification factor ($\beta$) among these plurality of connected MOS transistors. The gate potentials $D_1$-$D_n$ of the enhancement MOS transistors connected in the inserted circuit 20 are the source voltage $V_{CC}$ but a voltage slightly lower than the source voltage $V_{CC}$ may be applied by taking into consideration the actual operation characteristics.

If the logical circuit section 10 is composed of a plurality of enhancement type MOS transistors connected in series, the inserted circuit 20 is similarly composed of a plurality of serially connected enhancement type MOS transistors. FIG. 2 shows an example of reference voltage generating circuit suited to the situation where the logical circuit section 10 is composed of one enhancement type MOS transistor ($T_{E11}$ of FIG. 4). In this situation, the reference voltage $V_{ref}$ derived from the junction between the source of the depletion type MOS transistor $T_{D20}$ and the drain of the enhancement type MOS transistor $T_{E20}$ of FIG. 2 may be applied to the gate of the enhancement type MOS transistor $T_{E10}$ as shown in FIG. 4.

If the logical circuit section 10 includes a depletion type MOS transistor, a circuit with the identical structure may be used as the inserted circuit 20.

When the enhancement type MOS transistor $T_{E10}$ of FIG. 3 is in the OFF condition, the potential $V_{A'}$ at the junction point A' between the enhancement type MOS transistor $T_{E20}$ comprising the reference voltage generating circuit described above and the inserted circuit 20 becomes nearly equal to the potential at A when the logical circuit section 10 becomes ON.

The reference voltage $V_{ref}$ from the reference voltage generating circuit described above satisfies $$V_{ref}=V_{A'}+V_{GS}$$

where $V_{GS}$ is the gate-source voltage of the enhancement type MOS transistor $T_{E20}$.

Since the enhancement type MOS transistor $T_{E20}$ is in a saturated condition, the current $I_D$ shown in FIG. 1 can be expressed as $$I_D=\beta(V_{GS}-V_{th})^2/2.$$

Thus, $$V_{ref}=V_{A'}+V_{th}+(2I_D/\beta)^{\frac{1}{2}}.$$

If the voltage expressed by the equation above is inputted as the reference voltage to the enhancement type MOS transistor $T_{E10}$ of the load circuit shown in FIG. 3, the voltage necessary to cut off the enhancement MOS transistor $T_{E10}$ is $V_{A'}+(2I_D/\beta)^{\frac{1}{2}}$.

As explained above in connection with the structure of the inserted circuit 20, the voltage $V_{A'}$ at the point A' is determined in accordance with the potential at the point A and becomes nearly equal to the potential at A when the logical circuit 10 becomes ON while the enhancement type MOS transistor $T_{E10}$ is in the OFF condition. Accordingly, the cutoff tolerance at A of the load circuit for driving the logical circuit 10 becomes $(2I_D/\beta)^{\frac{1}{2}}$.

The current $I_D$ with the aforementioned tolerance is determined substantially by the depletion type MOS transistor $T_{D20}$, but since the amplification factor $\beta$ of the enhancement type MOS transistor $T_{E20}$ can be set optionally, an appropriate value can be optionally set as the cutoff tolerance at A. Since the structure of the inserted circuit 20 is determined in accordance with the logical circuit 10, the problem of the outputted $V_{ref}$ being too low does not occur.

In summary, the circuit of the present invention for generating a reference voltage to be inputted to the gate of an enhancement type MOS transistor in a load circuit composed of E/D MOS transistors for driving a logical circuit is constructed in accordance with the structure of the logical circuit. Unlike the conventional circuits wherein a reference voltage is derived from a circuit which is independent of the logical circuit so that the cutoff tolerance may become negative, the circuit according to the present invention can provide a cutoff tolerance of an optional magnitude regarding the cutoff potential of the enhancement type MOS transistor to which the reference voltage is applied. Moreover, the tolerance can be adjusted at will so that efficient reference voltage generating circuits with improved driving capabilties can be constructed.

The foregoing description of preferred embodiments of the invention has been presented for purposes of illustration and description. It is not intended to be exhaustive or to limit the invention to the precise form disclosed. Obviously, many modifications and variations are possible in light of the above teaching. The embodiments were chosen and described in order to best explain the principles of the invention and its practical application to thereby enable others skilled in the art to best utilize the invention is various embodiments and with various modifications as are suited to the particular use contemplated.

What is claimed is:

1. A logical circuit system comprising
   a logical circuit,
   a driving circuit which drives said logical circuit, and
   a reference voltage generating circuit which applies to said driving circuit a reference voltage having an appropriate value corresponding to the structure of said logical circuit, said reference voltage generating circuit including a first depletion type MOS transistor of which the gate and the drain are connected to a power source and a first enhancement type MOS transistor of which the gate and the drain are connected to the source of said first depletion type MOS transistor to form a first junction, said first enhancement type MOS transistor having its source coupled to an inserted circuit said driving circuit including a second enhancement type MOS transistor, having its gate coupled to said first junction, a second depletion type MOS transistor and a third depletion type MOS transistor, the drain of said second depletion type MOS transistor and the drain of said third depletion type MOS transistor being connected to said power source, the gate and the source of said second depletion type MOS transistor being connected to a second junction which is connected to the drain of said second enhancement type MOS transistor and to the gate of said third depletion type MOS transistor, the source of said second enhancement type MOS transistor and the source of said third depletion type MOS transistor being connected to said logical circuit through a third junction.

2. The logical circuit system of claim 1 further comprising an inserted circuit connected between the source of said first enhancement type MOS transistor and the ground.

3. The logical circuit system of claim 2 wherein said logical circuit comprises a plurality of enhancement type MOS transistors connected in parallel.

4. The logical circuit system of claim 3 wherein as inserted circuit comprises a third enhancement type MOS transistor which is substantially an equivalent of the transistor having the smallest amplification factor among said plurality of parallel-connected enhancement type MOS transistors.

5. The logical circuit system of claim 2 wherein said logical circuit comprises a plurality of enhancement type MOS transistor connected in series.

6. The logical circuit system of claim 2 wherein said logical circuit comprisies a single third enhancement type MOS transistor.

7. The logical circuit system of claim 6 wherein said inserted circuit comprises a single fourth enhancement type MOS transistor.

8. The logical circuit system of claim 7 wherein the gate, the drain and the source of said single third enhancement type MOS transistor are respectively connected to an input voltage source, said third junction and the ground, and wherein the gate, the drain and the source of said single fourth enhancement type MOS transistor are respectively connected to said power source, the source of said first enhancement type MOS transistor and the ground.

* * * * *

UNITED STATES PATENT AND TRADEMARK OFFICE
CERTIFICATE OF CORRECTION

PATENT NO. : 4,709,168

DATED : November 24, 1987

INVENTOR(S) : Setsufumi Kamuro, et al.

It is certified that error appears in the above-identified patent and that said Letters Patent are hereby corrected as shown below:

Column 6, line 30, Claim 4, delete "as" and insert ---said---.

Signed and Sealed this

Nineteenth Day of April, 1988

*Attest:*

DONALD J. QUIGG

*Attesting Officer*

*Commissioner of Patents and Trademarks*